United States Patent
Lin et al.

(10) Patent No.: US 7,368,928 B2
(45) Date of Patent: May 6, 2008

(54) VERTICAL TYPE HIGH FREQUENCY PROBE CARD

(75) Inventors: Hsin-Hung Lin, Hsinchu Hsiang (TW); Shih-Cheng Wu, Hsinchu Hsiang (TW); Wei-Cheng Ku, Hsinchu Hsiang (TW); Chien-Liang Chen, Hsinchu Hsiang (TW); Ming-Chi Chen, Hsinchu Hsiang (TW); Hendra Sudin, Hsinchu Hsiang (TW)

(73) Assignee: MJC Probe Incorporation, Chu-Pei, Hsinchu Hsiang (TW)

( * ) Notice: Subject to any disclaimer, the term of this patent is extended or adjusted under 35 U.S.C. 154(b) by 0 days.

(21) Appl. No.: 11/511,285

(22) Filed: Aug. 29, 2006

(65) Prior Publication Data

US 2008/0054918 A1 Mar. 6, 2008

(51) Int. Cl.
*G01R 31/02* (2006.01)
*G01R 31/26* (2006.01)

(52) U.S. Cl. .................. 324/754; 324/755; 324/758; 324/761

(58) Field of Classification Search ......... 324/754–765
See application file for complete search history.

(56) References Cited

U.S. PATENT DOCUMENTS 5,461,327 A * 10/1995 Shibata et al. .............. 324/760
5,525,911 A * 6/1996 Marumo et al. ............. 324/754
6,292,003 B1 * 9/2001 Fredrickson et al. ........ 324/754
6,861,858 B2 * 3/2005 Chen et al. ................. 324/755
2002/0041189 A1 * 4/2002 Okubo et al. ............... 324/754

FOREIGN PATENT DOCUMENTS

EP       0 180 013       5/1986

\* cited by examiner

*Primary Examiner*—Ha Tran Nguyen
*Assistant Examiner*—Emily Y Chan
(74) *Attorney, Agent, or Firm*—Bacon & Thomas, PLLC

(57) ABSTRACT

A vertical-type probe card includes a circuit board, which has signal circuits and grounding circuits arranged in such a manner that each signal circuit is disposed in parallel and adjacent to one grounding circuit and kept a predetermined distance from the grounding circuit, and a probe assembly, which is arranged at the bottom side of the circuit board and has an upper guide plate, a lower guide plate, a conducting layer provided on the lower guide plate, a plurality of signal probes respectively electrically connected to the signal circuits and adjacent to a plurality of compensation probes, and at least one grounding probe electrically connected to the grounding circuits in a manner that the signal, compensation and grounding probes are vertically inserted through the upper and lower guide plates, and the conducting layer is conducted with the compensation probe and the grounding probe while electrically insulated to the signal probe.

9 Claims, 9 Drawing Sheets

VERTICAL TYPE HIGH FREQUENCY PROBE CARD

BACKGROUND OF THE INVENTION

1. Field of the Invention

The present invention relates to probe cards and more particularly, to a vertical-type probe card for high frequency application.

2. Description of the Related Art

Following fast development of semiconductor technology, it realizes ICs (Integrated Circuits) micro-sized, versatile functions, and relatively faster processing speed and higher operation frequency. Therefore, the number of I/O (Input/Output) contacts on a multifunctional IC must be relatively high as well as on a semiconductor wafer. In consequence, a probe card capable of probing high-density contact array in wafer level test, such as a vertical-type probe card, becomes more and more important. Moreover, since electronic devices inside the ICs also tend to be operated in high speed and high frequency, electrical specifications of device characteristics under any possible bias condition, operation frequency, signaling mode, and etc. are critical. Therefore, designing a corresponding test probe card must consider all the critical factors and meet the transmission integrity of test conditions.

FIG. 1 shows a vertical-type probe card 1 according to the prior art. According to this design, a circuit board 10 of the probe card 1 passes high-frequency test signals 20 from a test machine (not shown) through a purity of coaxial transmission lines 11 to a probe set 12 to probe ICs 300 at a wafer 30. The coaxial transmission line 11 has an axial wire wrapped by a layer of dielectric material, which is in turn wrapped by a shielding metal electrically connected to the grounding potential of the circuit board 10 to maintain the characteristic impedance of the transmitted high-frequency test signal. The probe set 12 comprises an upper guide plate 121, a lower guide plate 122, and a plurality of vertical probes 120 inserted through the upper guide plate 121 and the lower guide plate 122 to keep standing on the circuit board 10 and to be respectively connected to the coaxial transmission lines 11 or other signal lines. According to this design, the probe set 12 is provided between the end of the coaxial transmission line 11 and the wafer 20, the upper guide plate 121 and the lower guide plate 122 are made of electrically insulating materials to prevent leakage current occurred among the probes 120, and each of the probes 120 is an individually conducting member without having an outer shielding metal like the coaxial transmission line 11. Therefore, when a high frequency signal is transmitted through the probe 120, a parasitic capacitor subject to the dielectric environment around the probe 120 will induce the dielectric loss of the high frequency signal. FIG. 2 is the frequency-characteristic curve of the high frequency signaling of the probe card 1. As illustrated, the return loss curve S22 shows the characteristic impedance mismatched of the high frequency signaling; the insertion loss curve S21 shows the passband frequency at −3 dB lowered than 200 MHz, which is far away from GHz segment of high frequency test specification.

FIG. 3 shows a probe structure 14 constructed according to European patent publication No. 0180013. According to this design, the probe structure 14 comprises a probe body 100 formed of a succession of body layers, and probes 102, 104 and 106 respectively inserted through the probe body 100. This design allows arrangement of an electrically grounded metal around the signal probe 102 to achieve the maintenance of characteristic impedance for the transmission of high frequency signal. However, because the probes 102, 104 and 106 are fitted into respective vias provided through the body layers and not flexible within the probe body 100, the hard metal structure of the probes 102, 104 and 106 may damage the test contacts on the test wafer or, the worst, destruct the internal circuit devices right below the test contacts when the probe structure 14 is operated to probe the test wafer. Therefore, this design of probe structure is not suitable for testing semiconductor wafers.

Therefore, it is desirable to provide a vertical-type probe card that maintains the characteristic impedance for transmission of high frequency signals without damaging to the ICs of the test sample.

SUMMARY OF THE INVENTION

The present invention has been accomplished under the circumstances in view. It is therefore an objective of the present invention to provide a vertical-type probe card, which achieves high quality transmission in passing high-frequency test signals, and is effective for use in a wafer level test.

To achieve this objective of the present invention, the vertical-type probe card comprises a circuit board and a probe assembly. The circuit board has a top surface and a bottom surface. Further, the circuit board is disposed with a plurality of signal circuits and a plurality of grounding circuits electrically connected to a grounding plane that is electrically conducted to a ground potential. At least one of the grounding circuits is parallel to the signal circuit and kept a predetermined distance from the signal circuit. The probe assembly is provided at the bottom surface of the circuit board, comprising a conducting layer, a plurality of signal probes, at least one compensation probe, at least one grounding probe, an upper guide plate, and a lower guide plate. The upper guide plate is mounted on the circuit board. The conducting layer is provided on the lower guide plate. The upper guide plate and the lower guide plate define therebetween a receiving chamber. The signal probe, the compensation probe, and the grounding probe are respectively made of conducting material, inserted through the two guide plates and held in a perpendicular manner relative to the circuit board. The signal probe and grounding probe are flexible in the receiving chamber. The signal probes are respectively electrically connected to the signal circuits. The grounding probe is electrically connected to the grounding circuits. The compensation probe is arranged in parallel to the signal probe. The conducting layer is conducted with the grounding probe and the compensation probe, but electrically insulated with the signal probes.

Therefore, when the signal circuits on the probe card are electrically connected to a test machine, the applied high-frequency test signal is transmitted through the signal circuits to the respective signal probes with which the grounded current flow through the grounding circuits and the compensation probes is accompanied to maintain the characteristic impedance for the transmission of the applied high-frequency test signal. Further, the free space of the receiving chamber between the upper guide plate and the lower guide plate makes the signal probes and the grounding probes flexible transversely, thus effectively eliminating the stress between the probes and test sample.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
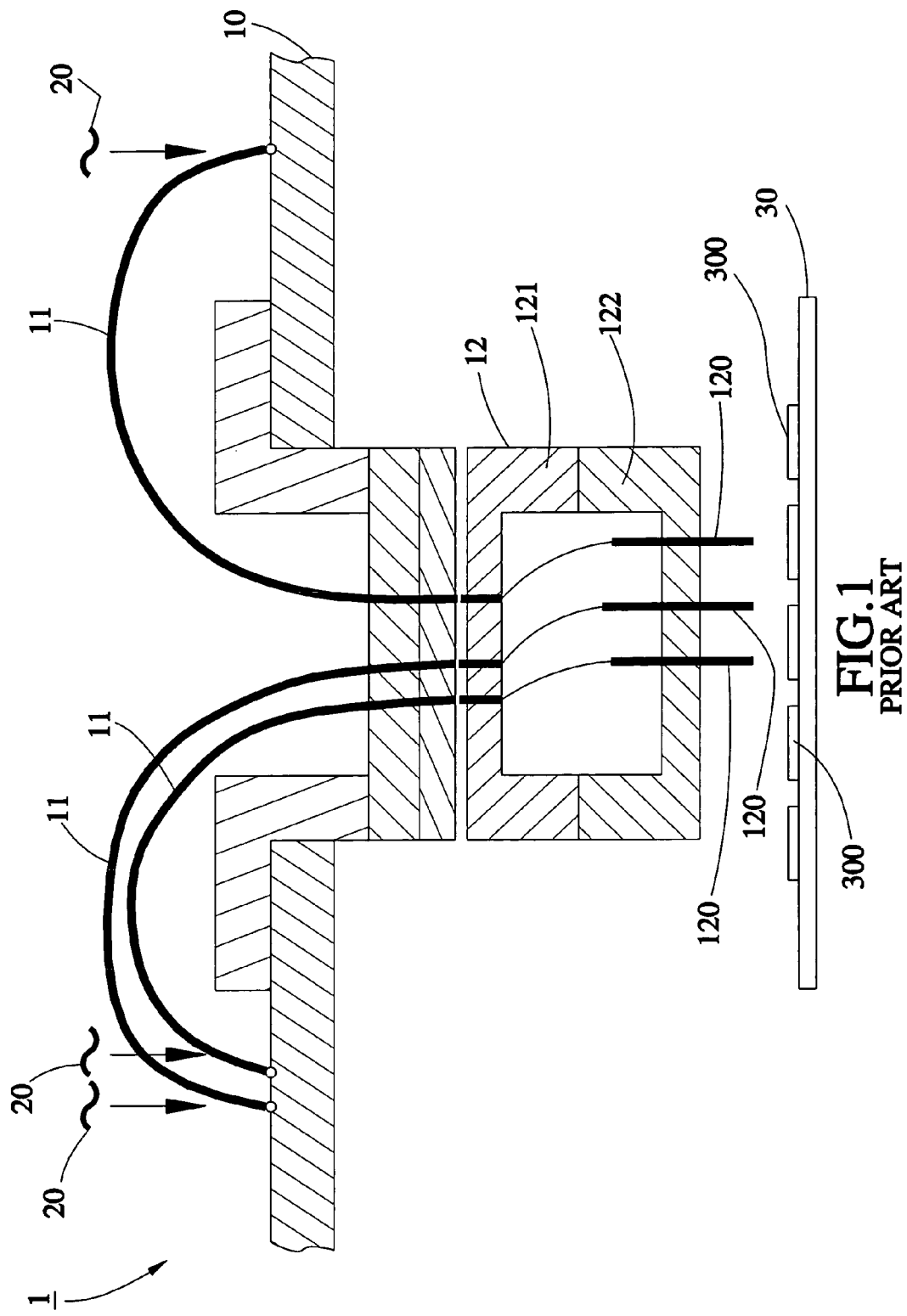
FIG. 1 is a schematic sectional view of a vertical-type probe card according to the prior art.
Figure 2:
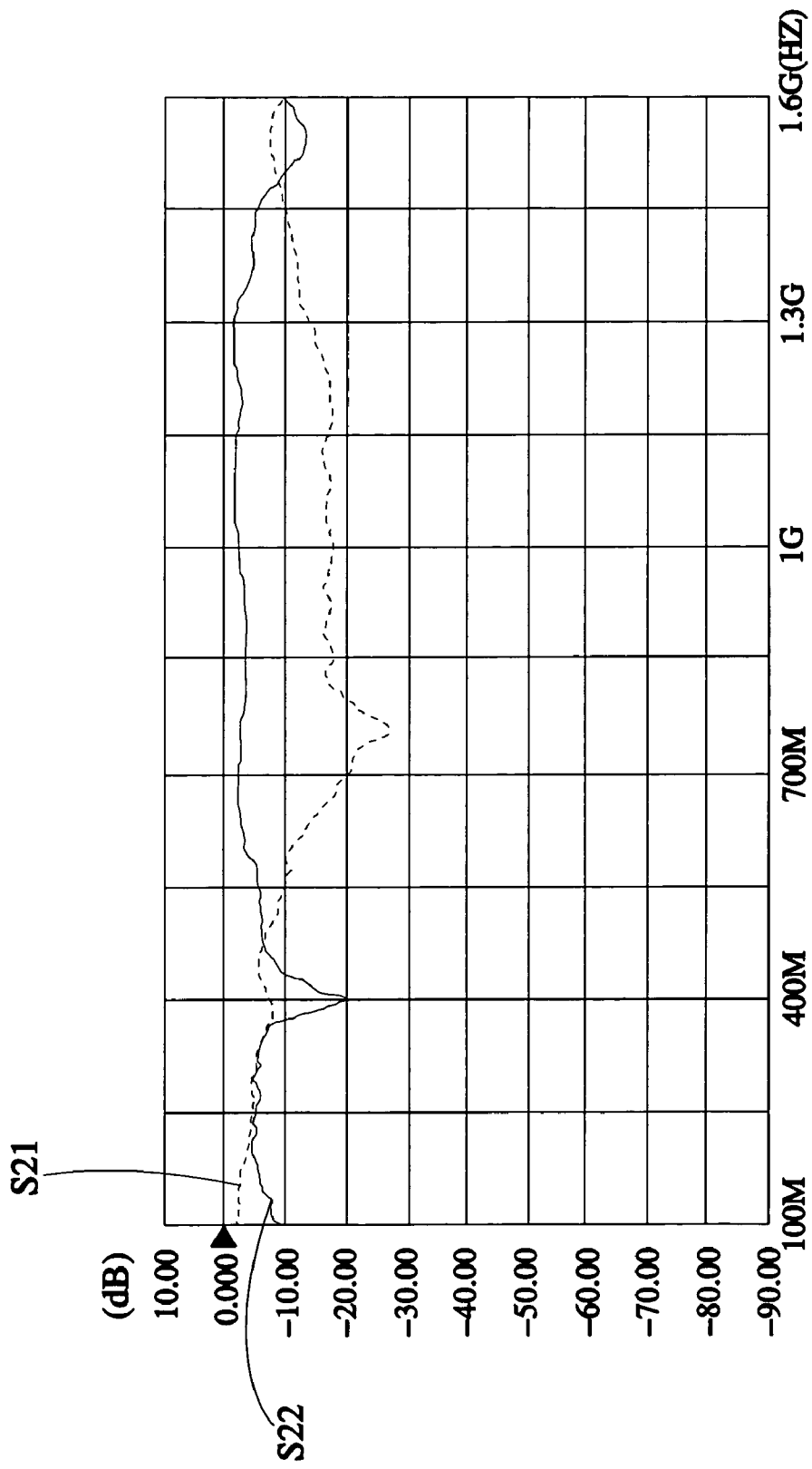
FIG. 2 is frequency characteristic curve obtained from the signal transmission by the probe card shown in FIG. 1.
Figure 3:
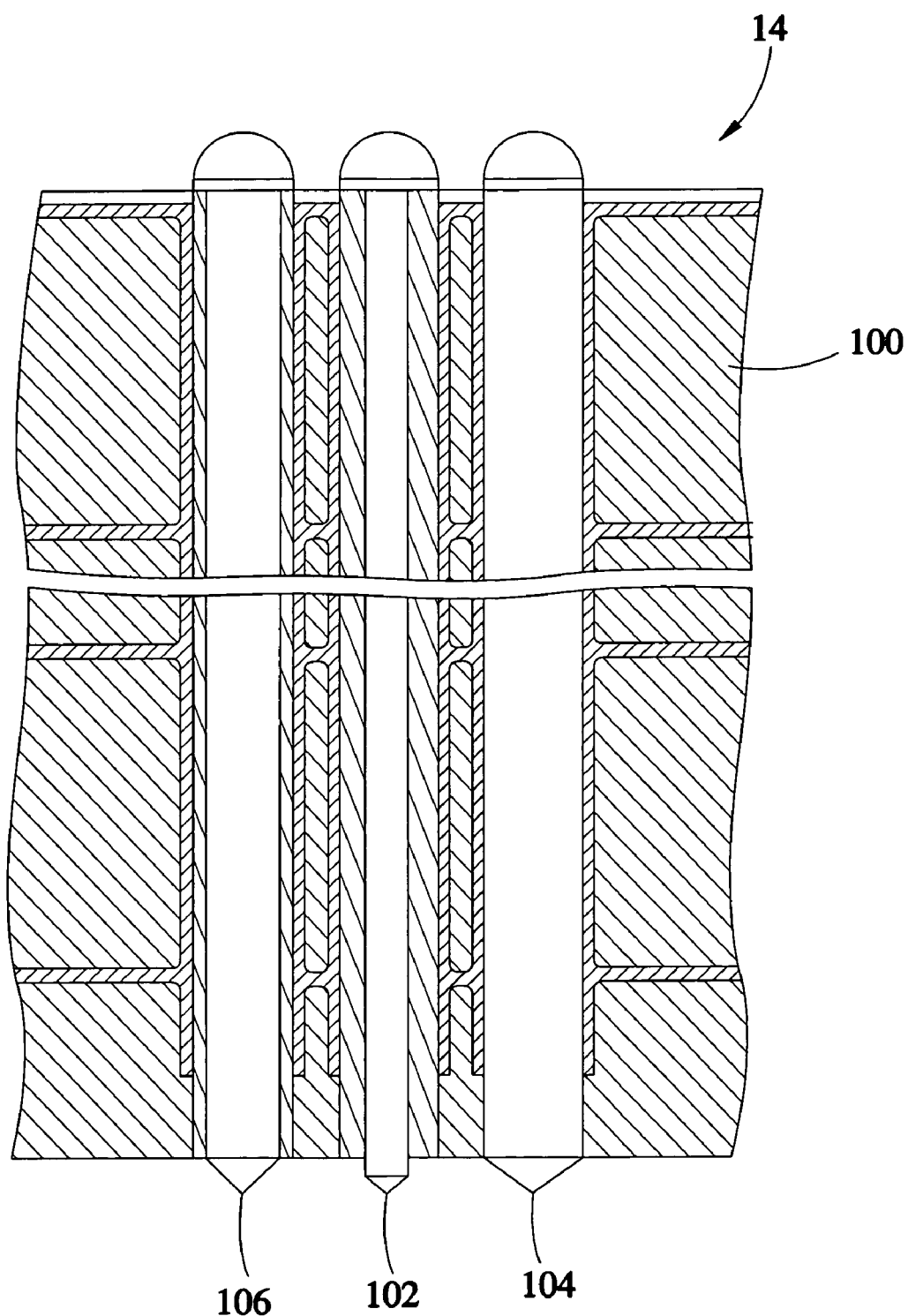
FIG. 3 is a sectional view of a part of a probe assembly constructed according to European patent publication No. 0180013.
Figure 4:
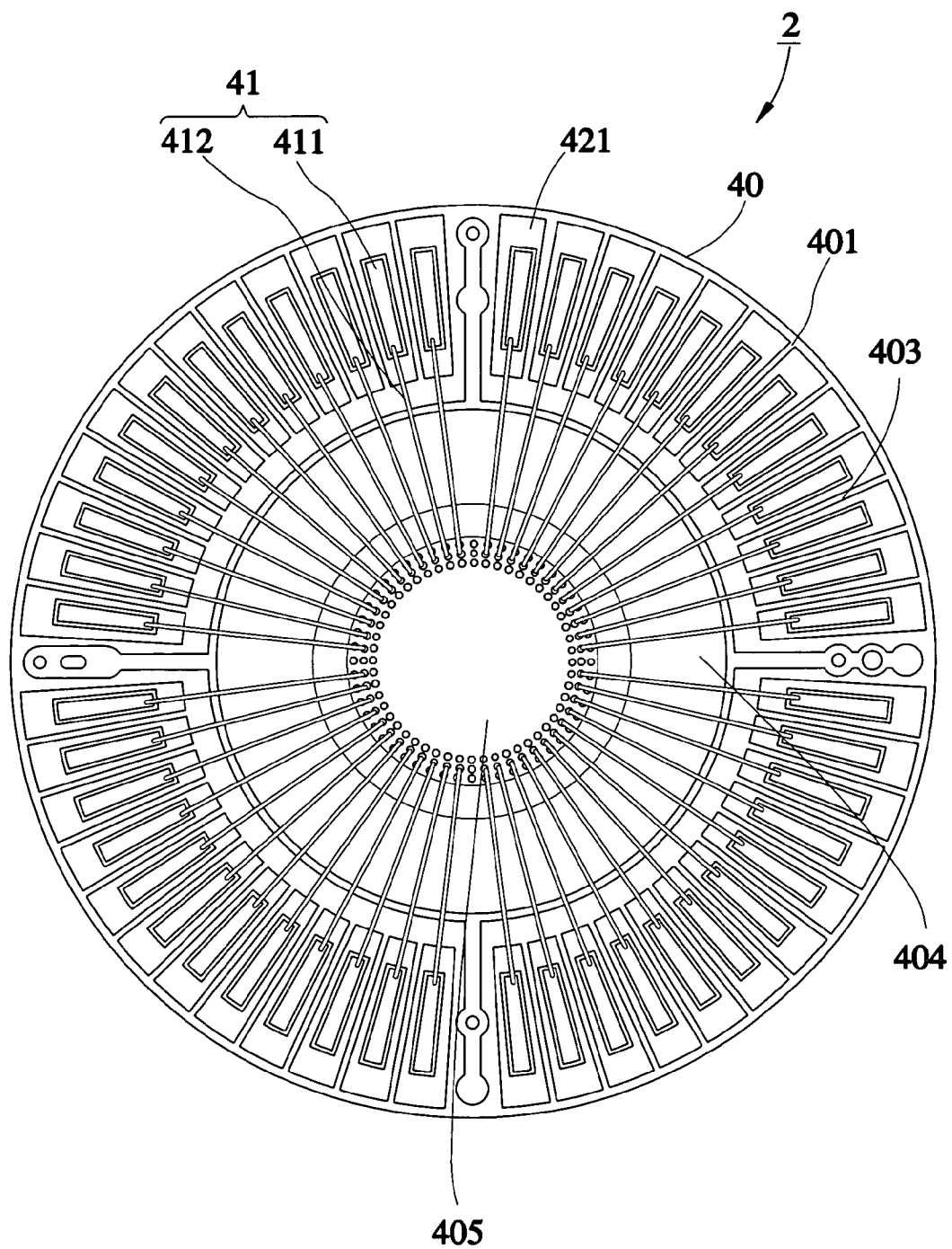
FIG. 4 is a top view of a vertical-type probe card in accordance with a first preferred embodiment of the present invention.
Figure 5:
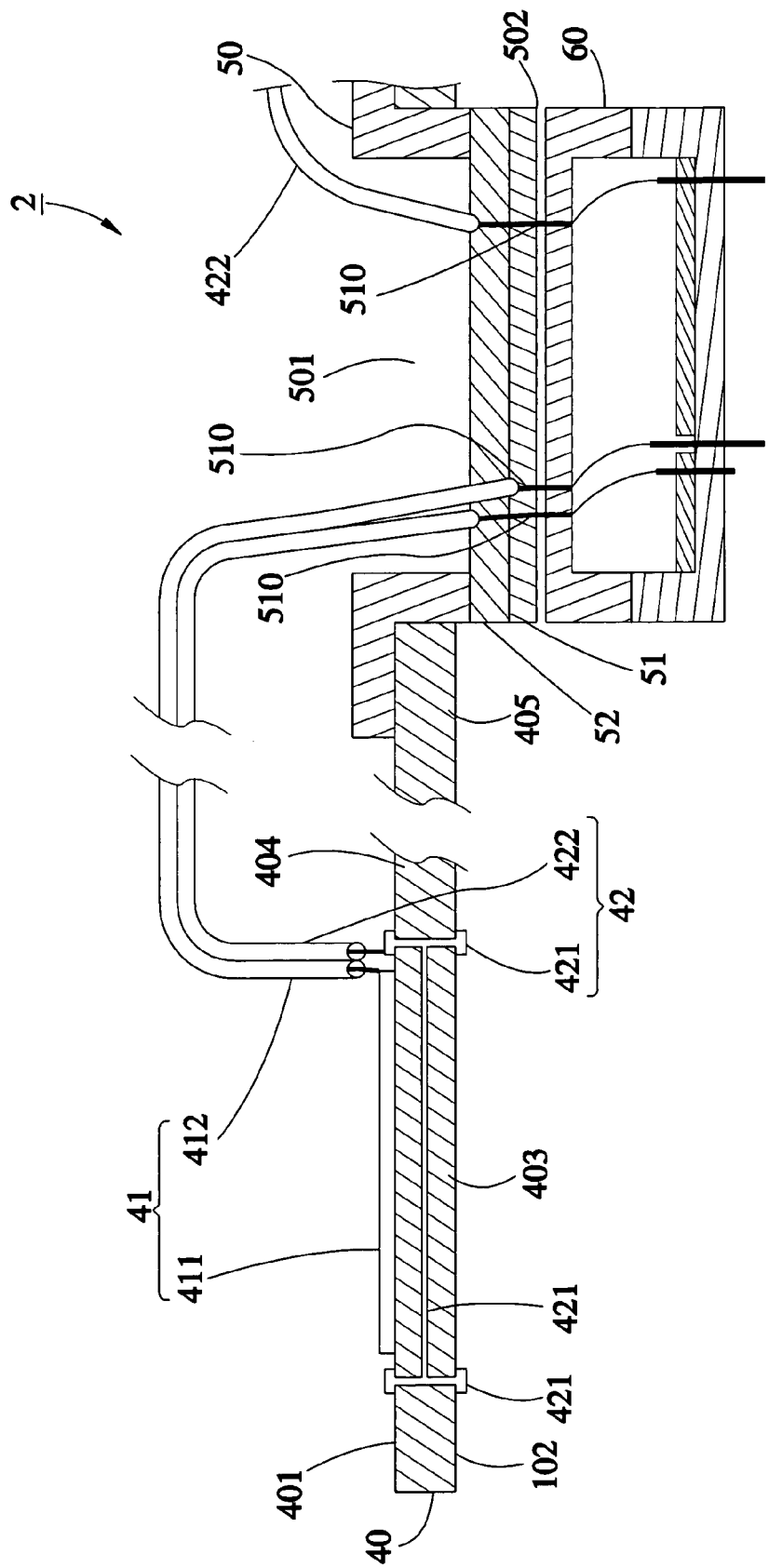
FIG. 5 is a schematic sectional view of a part of the probe card according to the first preferred embodiment of the present invention.

As shown in FIGS. 4 and 5, a vertical-type probe card 2 for testing semiconductor wafers or the like in accordance with a first preferred embodiment of the present invention comprises a circuit board 40, a probe holder 50, and a probe assembly 60.

The circuit board 40 has a top surface 401, a bottom surface 402, and defines from the border area toward the center area a test zone 403, a jumper zone 404, and a probe zone 405. The part of the top surface 401 within the test zone 405 is electrically connected to a test machine (not shown), which is controllable to output test signals including high frequency signals to the probe card 2. The circuit board 40 is provided with a plurality of signal circuits 41 and grounding circuits 42. At least one of the grounding circuits 42 is parallel to each of the signal circuits 41 and kept a predetermined distance apart from the signal circuit. The signal circuits 41 include a plurality of signal wires 411 arranged on the circuit board 40 and transmission lines 412 jumped from the test zone 403 to the probe zone 405. Similarly, the grounding circuits 42 include a plurality of grounding wires 421 and grounding lines 422.

The probe holder 50 is mounted through a center annual opening of the circuit board 40, having a top open chamber 501 for receiving the transmission lines 412 and the grounding lines 422, an electrically insulated bottom wall 51 having a bottom surface 502, and an electrically conductive grounding plane 52 covered on the top side of the bottom wall 51 The bottom wall 51 has a plurality of through holes 510 each of which has a diameter corresponding to the diameter of the transmission line 412. The transmission lines 412 are inserted through the grounding plane 52 into the bottom wall 51 and ended at bottom end of the respective through hole 510. The grounding lines 422 are electrically connected to the ground plane 52 and inserted into the bottom wall 51, and then ended at the bottom end of the respective through hole 720. Therefore, the transmission lines 412 and the grounding lines 422 are respectively exposed on the bottom surface 502 of the probe holder 50.

Figure 6:
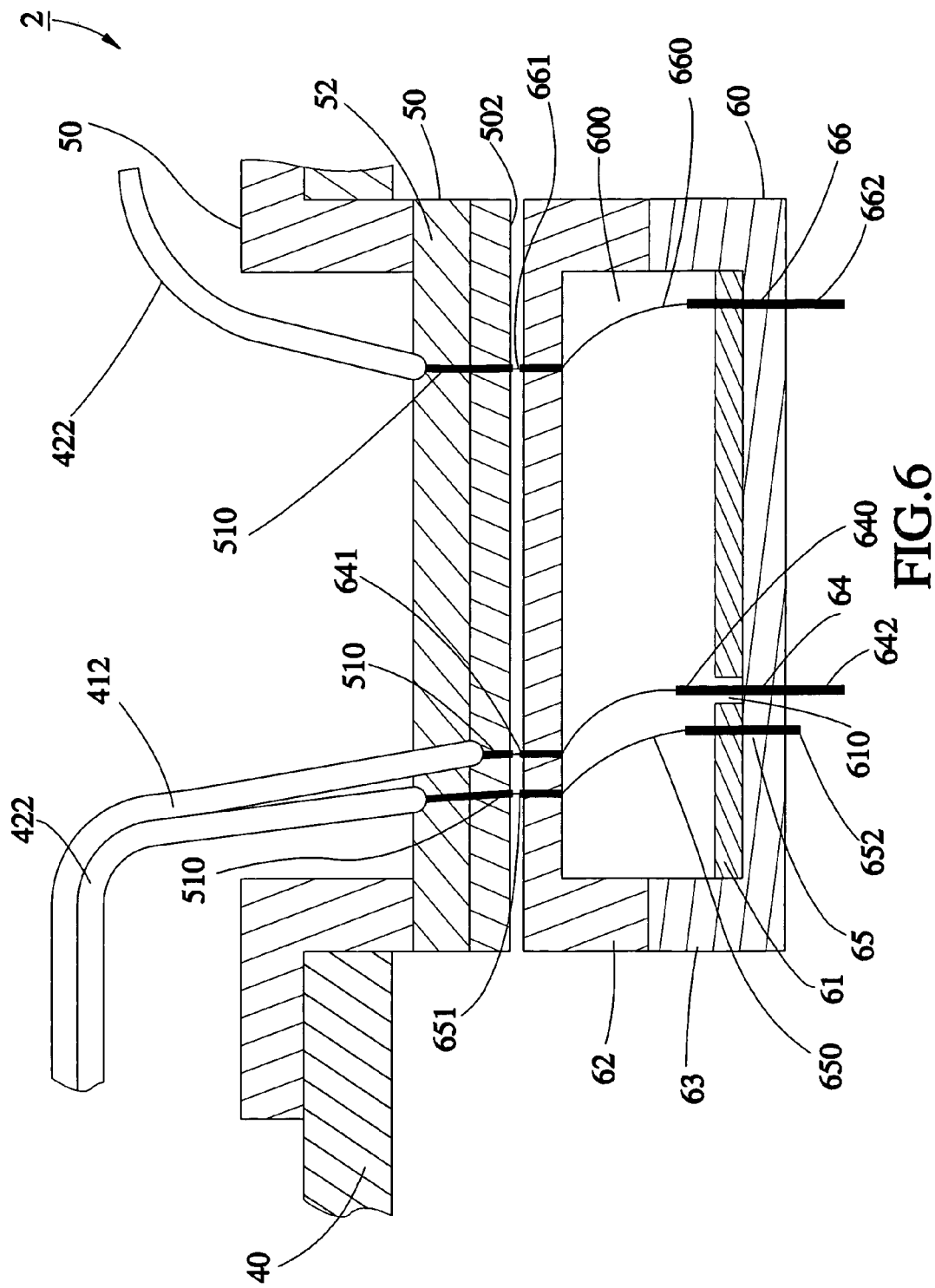
FIG. 6 is an enlarged view of a part of FIG. 5.

Referring to FIG. 6, the probe assembly 60 is mounted on the bottom surface 502 of the probe holder 50, comprising a conducting layer 61, an upper guide plate 62, a lower guide plate 63, and a plurality of signal probes 64, compensation probes 65, and grounding probes 66, which are inserted through the two guide plates 62 and 63 and held in a perpendicular manner relative to the circuit board 40. The two guide plates 62 and 63 are made of electrically insulating material and parallel arranged in a stack and defined therebetween a receiving chamber 600. Each of the probes 64, 65 or 66 is made of conducting material having a certain hardness and has a body 640, 650 or 660 within the receiving chamber 600, a rear end 641, 651 or 661 protruding over the top side of the upper guide plate 62, and a tip 642, 652 or 662 suspending beneath the lower guide plate 63. The rear ends 641 of the signal probes 64 are respectively electrically connected to the transmission lines 412 in the associating through holes 510 of the bottom wall 51. The rear ends 651 and 661 of the compensation probes 65 and grounding probes 66 are respectively electrically connected to the grounding lines 422 in the associating through holes 510, and then electrically common to the grounding plane 52. The conducting layer 61 is provided on the top side of the lower guide plate 63, having a plurality of openings 610 for the passing of the signal probes 64 without electrically contact with the signal probes 64. While the compensation probes 65 and the grounding probes 66 are directly contacted with the conducting layer 61. The compensation probes 65 are respectively arranged adjacent to the signal probes 64 in a parallel manner and kept a predetermined distance from the signal probes 64 to maintain the characteristic impedance during transmission of a high frequency signal through each signal probe 64. Since the compensation probes 65 are adopted to keep in parallel to the respective signal probes 64, only a small part of each the compensation probes 65, that is the tip 652, needs to be protruded over the bottom side of the lower guide plate 63. Therefore, the length of the tips 641 and 661 of the signal probes 64 and grounding probes 66 that protrude over the bottom side of the lower guide plate 63 is greater than the length of the tips 652 of the compensation probes 65. Thus, the tips 641 and 661 of the signal probes 64 and the grounding probes 66 are used to probe the test sample. Further, because the bodies 640, 650 and 660 of the probes 64, 65 and 66 suspend in the receiving chamber 600 between the two guide plates 62 and 63 without fixing to other structures, the bodies 640 and 660 are flexible transversely when the respective tips 641 and 661 receive a counterforce acting backward from the test sample.

Figure 7:
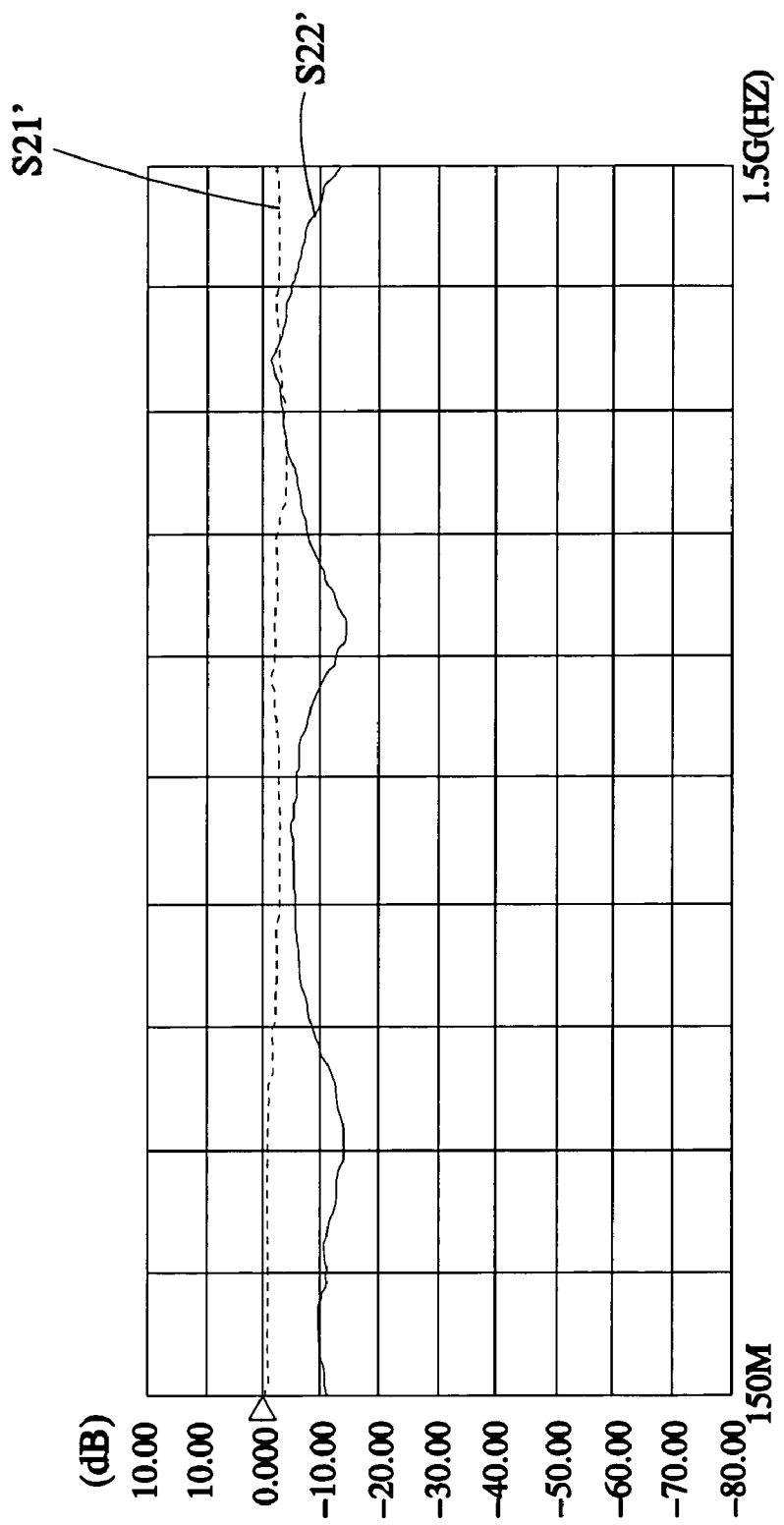
FIG. 7 is a frequency characteristic curve obtained from the signal transmission by the probe card according to the first preferred embodiment of the present invention.

When the electronic circuits on the test zone 403 of the probe card 2 are electrically connected to the test machine, the applied high-frequency test signal is transmitted through the signal circuits 41 to the respective signal probes 64, accompanied with the grounded current flow through the grounding circuits 42 and the compensation probes 65 to maintain the characteristic impedance for the transmission of the applied high-frequency test signal and eliminate any unnecessary electronic noises or electric coupling effect, thereby obtaining a high reliability test of the high-frequency transmission by the probe card 2. Referring to FIG. 7, the return loss curve S22' measured up to high frequency range shows excellent impedance matching for the transmission of a high-frequency signal by the probe card 2;

sequentially, the insertion loss curve S21' shows the threshold frequency of the passband signaling at gain −3 dB is close to GHz frequency range. Therefore, the high-frequency signaling quality of the probe card 2 is low return loss and excellent impedance matching. Further, when the signal probes 64 and the grounding probes 65 are normally contacted with the test sample, the free space between the two guide plates 62 and 63 allows them to be flexible transversely, thus eliminating the stress between the probes 64 and 65 and the test sample, i.e., preventing damage to the test sample.

Figure 8:
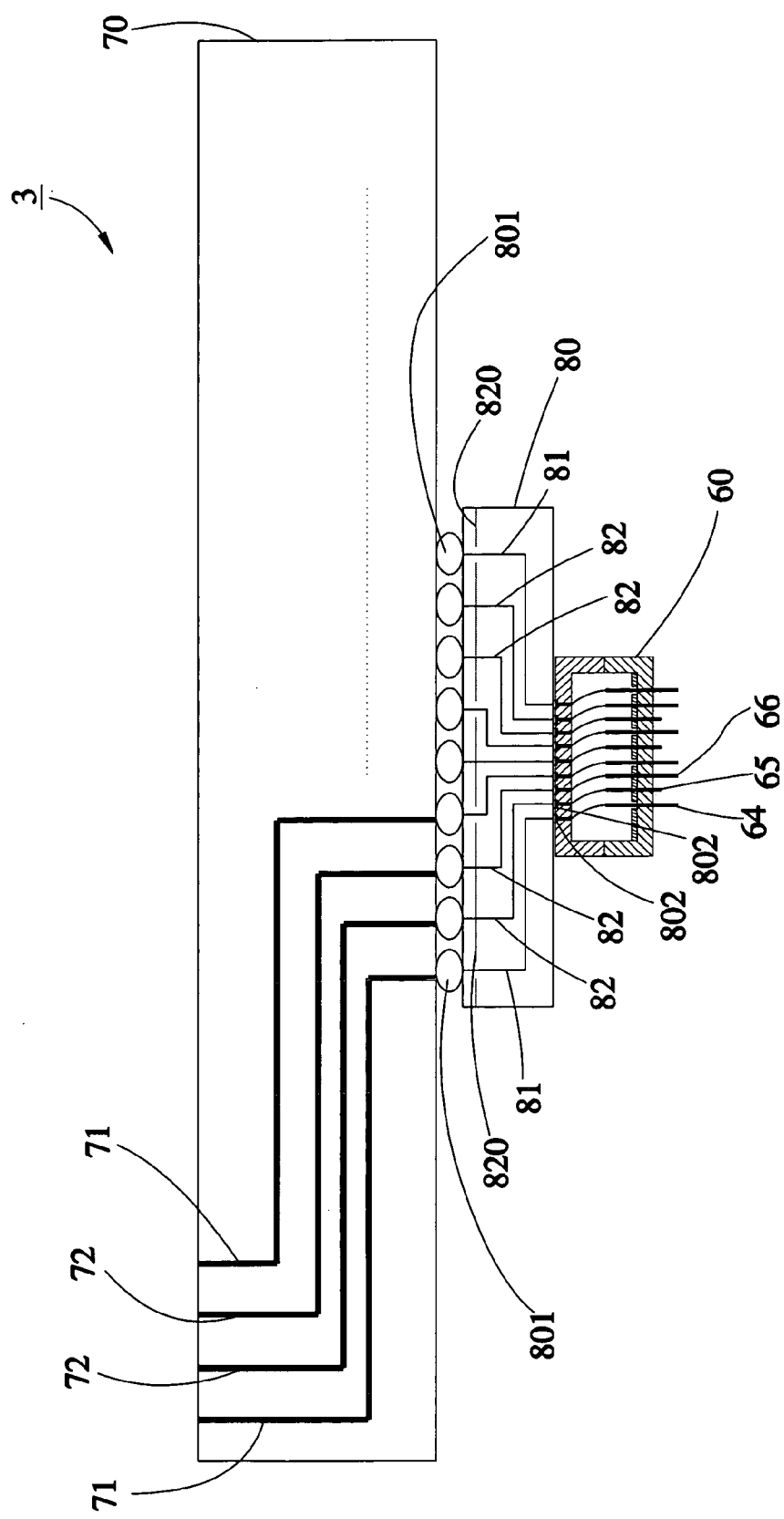
FIG. 8 is a schematic sectional view of a part of a vertical-type probe card in accordance with a second preferred embodiment of the present invention.

It is to be easily understood that the main purpose of the present invention is to improve the quality of the signal transmission through probes; therefore, the signaling trace is not limited to what is shown in FIGS. 4-6. FIG. 8 shows a vertical-type probe card 3 in accordance with a second preferred embodiment of the present invention. According to this second embodiment, the probe card 3 has a space transformer 80 provided at the bottom side of a circuit board 70, and the probe assembly 60 is mounted on the bottom side of the space transformer 80.

The circuit board 70 has signal circuits 71 and grounding circuits 72 respectively extending from the top surface of the circuit board to the bottom surface of the circuit board, and then electrically connected to the space transformer 80. At least one of the grounding circuits 72 is parallel to the signal circuit 71 and kept a predetermined distance therefrom to maintain the characteristic impedance during transmission of a high frequency signal through each signal circuit 71.

The space transformer 80 adopts a multi-layer organic (MLO) or multi-layer ceramic (MLC) structure, having signal wires 81 and grounding wires 82 layout inside. At least one of the grounding wires 82 is parallel to the signal wire 81. The pitch between each two signal wires 81 is relatively reduced when approaching the probe assembly 60. The grounding wires 82 are electrically connected to a grounding plane 820 formed a common ground potential inside the space transformer 80. The space transformer 80 has solder balls 801 and 802 provided on both of the top and bottom sides respectively for the connection of the circuit board 70 and the probe assembly 60 respectively, so that the signal wires 81 and the grounding wires 82 are respectively electrically connected to the signal circuits 71 and the grounding circuits 72 of the circuit board 70 through the solder balls 801, and are respectively electrically connected to the signal probes 64 and the grounding probes 66 of the probe assembly 60 through the solder balls 802, thus achieving the transformation for signal transmission from the circuit board 70 to the probe assembly 60.

When the electronic circuits on the probe card 3 are electrically connected to the test machine, the signal circuits 71 and the signal wires 81 transmit the applied high-frequency test signal from the test machine to the signal probes 64, accompanied with the grounded current flow through the grounding circuits 72, the grounding wires 82 and the compensation probes 65 to maintain the characteristic impedance for the transmission of the applied high-frequency test signal.

Figure 9:
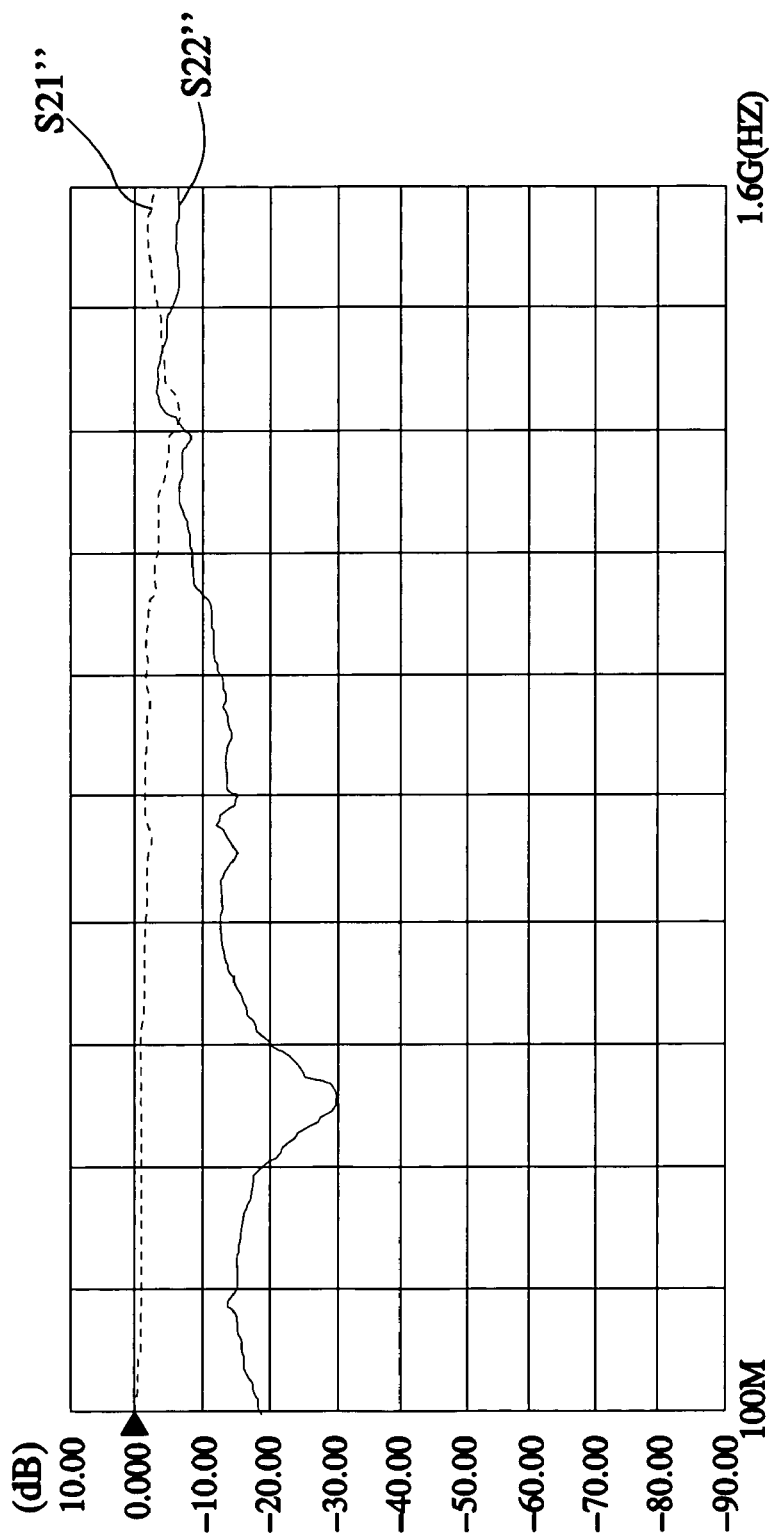
FIG. 9 is a frequency characteristic curve obtained from the signal transmission by the probe card according to the second preferred embodiment of the present invention.

Referring to FIG. 9, the return loss curve S22" measured up to high frequency range shows excellent impedance matching for the transmission of a high-frequency signal by the probe card 3; sequentially, the insertion loss curve S21" shows the threshold frequency of the passband signaling at gain −3 dB is as high as 1.2 GHz. Therefore, the high-frequency signaling quality of the probe card 3 is low return loss and excellent impedance matching.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A vertical-type probe card comprising:
   a circuit board having a top surface, a bottom surface opposite to the top surface, a plurality of signal circuits and a plurality of grounding circuits; and
   a probe assembly located below the bottom surface of said circuit board, said probe assembly comprising:
   an upper guide plate mounted on said circuit board;
   a lower guide plate defining with the upper guide plate a receiving chamber therebetween;
   a conducting layer made of conducting material and disposed on the lower guide plate;
   a plurality of signal probes made of conducting material and respectively electrically connected to said signal circuits;
   at least one grounding probe made of conducting material and electrically connected to said grounding circuits and said conducting layer, and
   at least one compensation probe made of conducting material and electrically connected to said conducting layer and arranged in parallel and adjacent to at least one of said signal probes;
   wherein said signal probe, said at least one compensation probe and said at least one grounding probe are inserted through said upper guide plate and said lower guide plate, and said signal probes and said at least one grounding probe are flexible in said receiving chamber.

2. The vertical-type probe card as claimed in claim 1, which said signal circuits comprise a plurality of transmission lines extending from said top surface to said probe assembly; said signal probes are respectively electrically connected to the transmission lines of said signal circuits.

3. The vertical-type probe card as claimed in claim 2, wherein each of said signal circuits is disposed in parallel and adjacent to at least one of said grounding circuits and kept apart from the adjacent at least one of said grounding circuits at a predetermined distance.

4. The vertical-type probe card as claimed in claim 3, further comprising a probe holder mounted to said circuit board and provided with a top open chamber for receiving the transmission lines of said signal circuits, a bottom surface adjacent to said probe assembly, and a grounding plane disposed on the bottom surface and electrically connected to said grounding circuits, wherein said transmission lines pass through said grounding plane and then are respectively connected with said signal probes.

5. The vertical-type probe card as claimed in claim 1, wherein said signal circuits and said grounding circuits are embedded in said circuit board.

6. The vertical-type probe card as claimed in claim 5, further comprising a space transformer arranged between said circuit board and said probe assembly, said space transformer having a plurality of signal wires and grounding wires arranged inside, said signal wires being respectively electrically connected to said signal circuits, said groundings wire being respectively electrically connected to said grounding circuits, said signal wires and said grounding wires each having a top end terminating in a top solder ball bonded to said circuit board and a bottom end terminating in a bottom solder ball bonded to said probe assembly, the pitch among the adjacent top solder balls being greater than the pitch among the adjacent bottom solder balls.

7. The vertical-type probe card as claimed in claim 6, wherein the signal probes are respectively connected to the signal wires of said space transformer, and said grounding probe is connected to the grounding wire of said space transformer.

8. The vertical-type probe card as claimed in claim 1, wherein said signal probe, said grounding probe, and said compensation probe each have a tip suspending beneath said lower guide plate, the length of the tip of said compensation probe being smaller than the length of the tips of said signal probe and said grounding probe, the tips of said signal probes and said grounding probe being used to probe a test sample.

9. The vertical-type probe card as claimed in claim 1, wherein said conducting layer has a plurality of openings; said signal probes are respectively inserted through the openings of said conducting layer and electrically insulated from said conducting layer.

* * * * *

UNITED STATES PATENT AND TRADEMARK OFFICE
CERTIFICATE OF CORRECTION

| | | |
|---|---|---|
| PATENT NO. | : 7,368,928 B2 | Page 1 of 1 |
| APPLICATION NO. | : 11/511285 | |
| DATED | : May 6, 2008 | |
| INVENTOR(S) | : Lin et al. | |

It is certified that error appears in the above-identified patent and that said Letters Patent is hereby corrected as shown below:

Title Page, Item (75) Inventor is corrected to read:
-- Hsin-Hung Lin, Hsinchu Hsiang (TW);
    Shih-Cheng Wu, Hsinchu Hsiang (TW);
    Wei-Cheng Ku, Hsinchu Hsiang (TW);
    Chien-Liang Chen, Hsinchu Hsiang (TW);
    Ming-Chi Chen, Hsinchu Hsiang (TW);
    Hendra Sudin, Hsinchu Hsiang (TW);
    Chih-Hao Ho, Hsinchu Hsiang (TW);
    Te-Chen Feng, Hsinchu Hsiang (TW) --.

Signed and Sealed this
Sixth Day of October, 2015

Michelle K. Lee
*Director of the United States Patent and Trademark Office*